(12) United States Patent
Hasegawa

(10) Patent No.: US 7,719,660 B2
(45) Date of Patent: *May 18, 2010

(54) EXPOSURE APPARATUS

(75) Inventor: Noriyasu Hasegawa, Tochigi-ken (JP)

(73) Assignee: Canon Kabushiki Kaisha (JP)

( * ) Notice: Subject to any disclaimer, the term of this patent is extended or adjusted under 35 U.S.C. 154(b) by 537 days.

This patent is subject to a terminal disclaimer.

(21) Appl. No.: 11/736,502

(22) Filed: Apr. 17, 2007

(65) Prior Publication Data

US 2007/0188721 A1    Aug. 16, 2007

Related U.S. Application Data

(63) Continuation of application No. 11/173,417, filed on Jul. 1, 2005, now Pat. No. 7,221,432.

(30) Foreign Application Priority Data

Jul. 2, 2004   (JP)   ............................ 2004-197269
Mar. 24, 2005  (JP)   ............................ 2005-085663

(51) Int. Cl.
  *G03B 27/54*   (2006.01)
  *G03B 27/52*   (2006.01)
  *G03B 27/42*   (2006.01)
(52) U.S. Cl. .............................. 355/67; 355/30; 355/53
(58) Field of Classification Search .................. 355/30, 355/53, 55, 67, 72, 75
  See application file for complete search history.

(56) References Cited

U.S. PATENT DOCUMENTS

| 6,333,775 | B1 * | 12/2001 | Haney et al. | 355/30 |
| 6,727,981 | B2 * | 4/2004 | Taniuchi et al. | 355/55 |
| 6,842,221 | B1 | 1/2005 | Shiraishi | 355/30 |
| 7,110,088 | B2 | 9/2006 | Tominaga | 355/53 |
| 7,221,432 | B2 * | 5/2007 | Hasegawa | 355/67 |

FOREIGN PATENT DOCUMENTS

| JP | 2691865 | 9/1997 |
| JP | 2003-332214 | * 11/2003 |

OTHER PUBLICATIONS

English Abstract for Japanese Patent Application 2691865.
English Abstract for Japanese Patent Application 2003-332214.

* cited by examiner

*Primary Examiner*—Hung Henry Nguyen
(74) *Attorney, Agent, or Firm*—Rossi, Kimms & McDowell LLP

(57) ABSTRACT

An exposure apparatus includes a projection optical system for projecting a pattern of a mask onto an object using a light with wavelength of 20 nm or less from a light source, and first and second accommodating parts for accommodating the projection optical system and the mask or the object, said first and second accommodating part has different pressures, wherein said a $Ps/Po \geq 100$ and $Ps \leq 10^{-3}$ Pa are met, where Po is the pressure of the first accommodating part, and Ps is the pressure of the second accommodating part.

12 Claims, 9 Drawing Sheets

EXPOSURE APPARATUS

This is a continuation of prior application Ser. No. 11/173,417, filed Jul. 1, 2005 which is now U.S. Pat. No. 7,221,432, to which priority under 35 U.S.C. 120 is claimed and which is hereby incorporated by reference in its entirety as if fully set forth herein.

BACKGROUND OF THE INVENTION

The present invention relates generally to an exposure apparatus that transfers a pattern of a mask (reticle) onto an object such as a single crystal substrate for a semiconductor wafer and a glass plate for a liquid crystal display ("LCD"), and more particularly to an exposure apparatus that exposes an object using a light with a wavelength of 20 nm or less in a reduced or vacuum environment. The present invention is suitable for an exposure apparatus that uses an extreme ultraviolet light (EUV light) (referred to as an "EUV exposure apparatus" hereinafter).

Along with the recent demands on finer processing and improved economical efficiency, the further improvement of resolution and productivity of the projection exposure apparatus has been increasingly required. In the improvement of resolution, shortening the wavelength of exposure light is general, and recently, an EUV exposure apparatus using EUV light with a wavelength of 10 to 15 nm has been proposed. The EUV light is easily absorbed by air and helium etc., a conventional EUV exposure apparatus accommodates an optical system, mask and object in a vacuum chamber, and exposes with the inside maintained to a vacuum or reduce environment (referred to as only a "vacuum environment" hereinafter).

However, when the mask and object are carried into and carried out of the vacuum chamber, an atmosphere flows into the chamber and the vacuum environment is broken. In addition, it takes a long time to form again a predetermined vacuum environment by evacuating the vacuum chamber. Moreover, organic matters generated from a resist on the object contaminate the optical system during exposure. The contaminated optical system causes various problems, such as a decreased light intensity and throughput, a non-uniform distribution, and a lower resolution etc.

An EUV exposure apparatus that divides the vacuum chamber into plural areas (accommodating parts) and accommodates the mask, object and optical system in different accommodating parts has been proposed (see, for example, Japanese Patent No. 2,691,865 and Japanese Patent Application, Publication No. 2003-332214). The separate accommodating parts enable, for example, the accommodating part that accommodates the optical system to maintain the vacuum environment even when the object is carried out of the vacuum chamber to exchange the object. As a result, after the object is exchanged, only the accommodating part that accommodates the object may be evacuated. Therefore, a time period necessary to form a predetermined vacuum environment shortens, and the optical system is protected from contaminations during exposure.

However, Japanese Patent No. 2,691,865 arranges a light-transmitting thin film window between the accommodating parts, and causes the decreases of the light intensity and throughput because the thin film window absorbs the exposure light. An exposure apparatus of Japanese Patent Application, Publication No. 2003-332214 discloses a pressure difference formed between the accommodating parts. However, it requires to control an interval between a connecting part that partitions two accommodating parts and the object to 20 μm or less for a desired pressure difference, and the control over the pressure difference is difficult. Moreover, Japanese Patent Application Publication No. 2003-332214 sets a vacuum level of the accommodating part for the optical system to $1 \times 10^{-5}$ Pa or less (paragraph number 0019) and a vacuum level of the accommodating part for the object and mask to $1 \times 10^{-4}$ Pa or more (paragraph number 0020) in one example of the pressure difference. However, the inventors have discovered that this pressure condition is insufficient to improve both the resolution and productivity.

In other words, when carbon molecules such as hydrocarbon, remain on an exposure optical path, the carbon adheres to a surface of the optical element due to the irradiated light, and absorbs the EUV light, causing decreased reflectivity. Such carbon originates in an escape gas from a driving mechanism that drives the object and the mask. The prior art does not propose any pressure controls to prevent the carbon adhesion.

BRIEF SUMMARY OF THE INVENTION

The present invention is directed to an exposure apparatus that easily improves both the resolution and productivity.

An exposure apparatus according to one aspect of the present invention includes a projection optical system for projecting a pattern of a mask onto an object using a light with wavelength of 20 nm or less from a light source, and first and second accommodating parts for accommodating the projection optical system and the mask or the object, said first and second accommodating part has different pressures, wherein said a $Ps/Po \geqq 100$ and $Ps \leqq 10^{-3}$ Pa are met, where Po is the pressure of the first accommodating part, and Ps is the pressure of the second accommodating part.

An exposure apparatus of another aspect of the present invention includes a projection optical system for projecting a pattern of a mask onto an object using a light with wavelength of 20 nm or less from a light source, first and second accommodating parts for accommodating the projection optical system and the mask or the object, said first and second accommodating part has different pressures, and a connecting part for defining an opening part that connects said second accommodating part with said first accommodating part, wherein said connecting part has a convex section that projects toward the object, and the convex section includes a projecting part that bends in almost parallel to the accommodated mask or object, and defines the opening part, and wherein said opening part of the connecting part has an area of 125 mm² or more, an average distance between the accommodated mask or object and the projecting part is 3 mm or less, and a length of the projecting part in the scan direction is 5.2 mm or more.

An exposure apparatus of another aspect of the present invention includes a projection optical system for projecting a pattern of a mask onto an object using a light with wavelength of 20 nm or less from a light source, first and second accommodating parts for accommodating the projection optical system and the mask or the object, said first and second accommodating part has different pressures, and a connecting part for defining an opening part that connects said second accommodating part with said first accommodating part, wherein said connecting part has a convex section that projects toward the mask, and the convex section includes a projecting part that bends in almost parallel to the mask, and defines the opening part, and wherein said opening part of the connecting part has an area of 2000 mm² or more, an average distance between the mask and the projecting part is 2 mm or less, and a length of the projecting part in the scan direction is 5.2 mm or more.

An exposure apparatus of another aspect of the present invention includes a projection optical system for projecting a pattern of a mask onto an object using a light with wavelength of 20 nm or less from a light source, first and second accommodating parts for accommodating the projection optical system and the mask or the object, said first and second accommodating part has different pressures, a connecting part for defining an opening part that connects said second accommodating part and said first accommodating part to each other, and a cooling part for cooling a member to form the opening part, wherein said a Ps≧Po is met, Po is the pressure of the first accommodating part, and Ps is the pressure of the second accommodating part.

An exposure apparatus of another aspect of the present invention includes a projection optical system for projecting a pattern of a mask onto an object using a light with wavelength of 20 nm or less from a light source, accommodating parts for separately accommodating the projection optical system and the mask or the object, said accommodating parts has different pressures, and a connecting part for having an opening part that connects accommodating parts to each other, wherein said connecting part has a convex section that projects from the projection optical system to the object, and the convex section includes a projecting part that bends in almost parallel to a surface of the mask or object and defines the opening part.

An exposure apparatus of another aspect of the present invention includes a projection optical system for projecting a pattern of a mask onto an object using a light with wavelength of 20 nm or less from a light source, first and second accommodating parts for accommodating the projection optical system and the mask or the object, and a connecting part for defining an opening part that connects said second accommodating part and said first accommodating part to each other, wherein said first and second accommodating parts and a partition to form the opening part are separately supported.

A fabrication method of the above exposure apparatus according to still another aspect of the present invention includes the steps of defining a pressure difference of both accommodating parts, and setting a length of the projecting part in a horizontal direction to the mask or the object, a distance between the projecting part and the mask or the object, and an opening area of the connecting part based on the pressure difference defined at the defining step.

A device fabricating method according to still another aspect of the present invention includes step of exposing an object using the above exposure apparatus, and performing a development process for the object exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
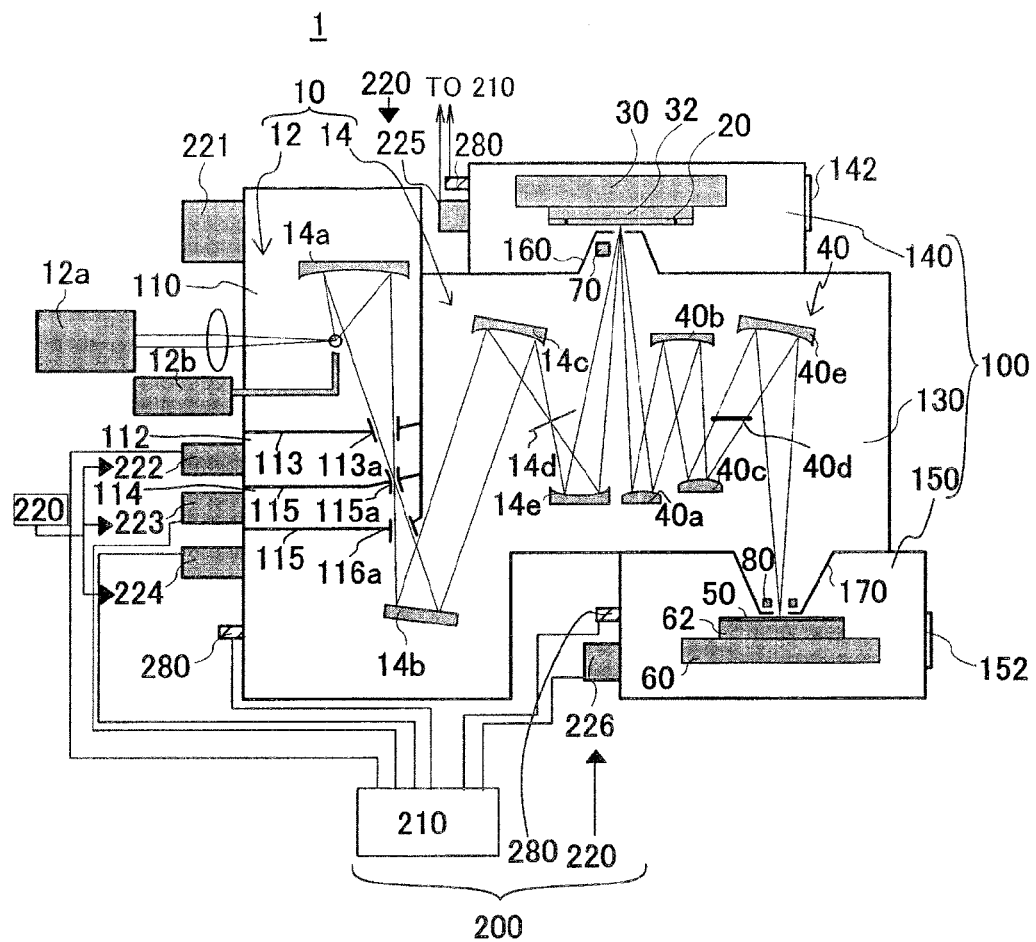
FIG. 1 is a schematic sectional view of an EUV exposure apparatus of the present invention.

With reference to the accompanying drawings, a description will be given of an EUV exposure apparatus 1 of one aspect according to the present invention. Here, FIG. 1 is a structure of the exposure apparatus 1. The exposure apparatus 1 is a projection exposure apparatus that uses, as illumination light for the exposure, EUV light (e.g., with a wavelength of 13.4 nm) to perform a step-and-scan exposure that transfers a circuit pattern formed on a mask 20 onto an object 50. Such an exposure apparatus is suitable for a sub-micron or quarter-micron lithography process. This embodiment exemplarily describes a step-and-scan exposure apparatus (which is also called "a scanner"). The "step-and-scan manner", as used herein, is an exposure method that exposes a mask pattern onto the object by continuously scanning the object relative to the mask, and by moving, after an exposure shot, the object stepwise to the next exposure area to be shot.

Referring to FIG. 1, the exposure apparatus 1 includes an illumination apparatus 10, the mask 20, mask state 30 mounted with the mask 20, a projection optical system 40, the object 50, a wafer stage 60 mounted with the object 50, an alignment detecting mechanism 70, a focus position detecting mechanism 80, a vacuum chamber 100, and a pressure control apparatus 200.

The illumination apparatus 10 uses the EUV light corresponding to an arc-shaped field of the projection optical system 40 to illuminate the mask 20, and includes a EUV light source 12 and an illumination optical system 14.

The EUV light source 12 uses, for example, a laser plasma light source. It generates high temperature plasma by irradiating a pulsed laser beam 12a with high intensity generated from an excitation laser 12a onto a target material supplied from a target supply apparatus 12b in a vacuum chamber, and uses the EUV light which has been emitted from the plasma. The target material may use a metallic thin film, a gas jet, a liquid-drop, etc. The laser beam preferably has high repetitive frequency, e.g., usually several kHz, for increased average intensity of the emitted EUV light from the plasma. Alternatively, the EUV light source 12 may use a discharge plasma light source. The discharge plasma light source emits gas around an electrode put in vacuum, applies pulse voltage to the electrode for discharge, and induces high temperature plasma. This plasma emits the EUV light to be utilized. Of course, the EUV light source 12 is not limited to them, but may use any technology known in the art.

The illumination optical system 14 includes a condenser mirror 14a, an optical integrator 14b, a mirror 14c, an aperture stop 14d (for controlling an angle of view), and a mirror 14e. The condenser mirror 14a condenses the EUV light that is radiated approximately isotropically from the laser plasma, and the optical integrator 14b uniformly illuminates the mask 20 with a predetermined aperture. The illumination light that has passed through the optical integrator 14b illuminates the mask 20 through the mirror 14c and mirror 14e. The aperture stop 14e is arranged in a position conjugate with the mask 20, and limits an illumination area on the mask 20 to an arc-shaped.

The mask 20 is a reflection mask that forms a circuit pattern or image to be transferred, and supported and driven by the mask stage 30. The diffracted light from the mask 20 is reflected by the projection optical system 30 and projected onto the object 40. The mask 20 and the object 40 are arranged optically conjugate with each other. The exposure apparatus 1 is a scanner, and projects a reduced size of the pattern on the mask 20 on the object 40 by scanning the mask 20 and the object 40.

The mask stage 30 supports the mask 20 through a mask chuck 32 and is connected to a moving mechanism (not shown). The mask stage 30 may use any structure known in the art. A moving mechanism (not shown) may include a linear motor etc., and drives the mask stage 30 at least in a direction X and moves the mask 20. Here, the exposure apparatus 1 assigns the direction X to scan the mask 20 or the object 40, a direction Y perpendicular to the direction X, and a direction Z perpendicular to the mask 20 or the object 40.

The projection optical system 40 uses plural mirrors (multilayer mirrors) 40a to 40c and 40e and an aperture stop 40d for limiting an opening, to project a reduced size of the pattern formed on the mask 20 onto the object 50. The number of mirrors is about four to six. For wide exposure area with the small number of mirrors, the mask 20 and object 50 are simultaneously scanned to transfer a wide area that is an arc-shaped area or ring field apart from the optical axis by a predetermined distance. Shape on a reflection surface of each mirror is a spherical surface or aspherical surface of a convex surface or concave surface. The projection optical system 40 has a NA of about 0.1 to 0.2.

Each mirror is formed by grinding and polishing a substrate that is made of a rigid and hard material with a small coefficient of thermal expansion, processing the substrate into a predetermined reflective surface, and forming a multilayer film such as molybdenum/silicon on a reflection surface that has a predetermined reflection surface shape. If an incident angle not over a surface of the mirror surface, the wavelength of the EUV light that provide the maximum reflectance varies according to locations on multilayer film with a constant film cycle. Therefore, the film cycle distribution needs to efficiently reflect the EUV light with the same wavelength on the mirror surface.

The instant embodiment uses a wafer as the object 50 to be exposed, but it may include a liquid crystal plate and a wide range of other objects to be exposed. Photoresist is applied onto the object 50.

The wafer stage 60 supports the object 50 by a wafer chuck 62. The wafer stage 60 moves the object 50, for example, using a liner motor in XYZ directions. The positions of the mask stage 30 and wafer stage 60 are monitored, for example, by a laser interferometer, driven at a constant speed ratio, and those position and posture are controlled.

The alignment detection mechanism 70 measures a positional relationship between the position of the mask 20 and the optical axis of the projection optical system 40, and a positional relationship between the position of the object 50 and the optical axis of the projection optical system 40, and sets positions and angles of the mask stage 30 and the wafer stage 60 so that a projected image of the mask 20 may be positioned in place on the object 50.

The focus position detecting mechanism 80 measures a focus position in the direction Z on the object 50 surface, and control over a position and angle of the wafer stage 60 may always maintain the object 50 surface at an imaging position of the projection optical system 40 during exposure.

The vacuum chamber 100 accommodates a part of the illumination apparatus 10, the mask stage 30, the projection optical system 40 and the wafer stage 60 in the predetermined accommodating parts, and maintains a pressure environment of each accommodating parts. The vacuum chamber 100 includes plural accommodating parts 110, 112, 114, 130, 140 and 150, connecting parts 113, 115, 160 and 170. While the accommodating parts 130, 140 and 150 are separate members in the instant embodiment, at least one of the accommodating parts 140 and 150 may be separate from the accommodating part 130 according to the present invention. Thereby, the optical system is less contaminative than the conventional.

The accommodating part 110 accommodates a part of the illumination apparatus 10, and is connected to the accommodating parts 112 and 114. The accommodating parts 110 and 112 are partitioned by the connecting part 113, and both parts are connected each other through an opening part 113a. The accommodating parts 114 and 130 are partitioned by the connecting part 116, and both parts are connected to each other through an opening part 116a. The accommodating parts 110, 112 and 114 are exhausted by the pressure control apparatus 200 described later, prevent to attenuate by absorbing the EUV light to the gas, and removes a debris. The connecting parts 113, 115 and 116 prevent to adhere the debris generated from the EUV light source and ingressed into the accommodating part 130 to the optical element. The opening parts 113a, 115a and 116a guide the EUV light.

The accommodating part 130 accommodates a part of the illumination apparatus 10 and the projection optical system 40, and maintains a predetermined pressure environment. The accommodating part 130 maintains to the high vacuum to prevent the attenuation of the EUV light. If it is necessary, a part of the illumination optical system 14 and the projection optical system 40 are accommodated in separate accommodating parts.

The inventor discovers that a partial pressure of a molecule including carbon to have to be maintained the pressure of at least $10^{-6}$ Pa or less, desirably $10^{-7}$ Pa or less, to effectively prevent adhering the carbon from the molecule including the carbon to the optical element (mirror, integrator, and aperture stop, etc.) of the optical system. Therefore, the pressure that the accommodating part 130 should maintain is $10^{-6}$ Pa or less, desirably $10^{-7}$ Pa or less. In this pressure, because the molecular density is low, a possibility of adhering to the optical element of the optical system, and a decrease and irregularity of the light intensity by an adhesion amount can be disregarded for an optical performance (the resolution and throughput) of the exposure apparatus.

The accommodating part 140 accommodates the mask 20, the mask stage 30, the mask chuck 32, and the moving mechanism (not shown) connected to the mask stage 30, and maintains a predetermined pressure environment. The accommodating part 140 is exhausted by the pressure control apparatus 200 described later, prevent to attenuate by absorbing the EUV light to the gas, and prevents a lot of internal gases from flowing into the accommodating part 130. The accommodating part 140 is connected to the accommodating part 130 through the opening part 166 of the connecting part 160 described later. The accommodating part 140 includes a mask change door 142. The mask change door 142 opens when the raticle 20 is carried into and carried out, and closes during exposing and after carry out. Although the mask change door 142 is arranged on a side surface of the accommodating part 140 in FIG. 1, the position is not limited. The mask change door 142 is a sealed structure to prevent an inflow of an external atmosphere.

The accommodating part 150 accommodates the object 50, the wafer stage 30, the wafer chuck 32, the moving mechanism (not shown) connected to the wafer stage 30, and maintains a predetermined pressure environment. The accommodating part 150 is exhausted by the pressure control apparatus 200 described later, prevent to attenuate by absorbing the EUV light to the gas, and prevents a lot of internal gases from flowing into the accommodating part 130. The accommodating part 150 is connected to the accommodating part 130 through the opening part 176 of the connecting part 170 described later. The accommodating part 150 includes a mask change door 152. The mask change door 152 opens when the object 50 is carried into and carried out, and closes during exposing and after carry out. Although the mask change door 152 is arranged on a side surface of the accommodating part 150 in FIG. 1, the position is not limited. The mask change door 152 is a sealed structure to prevent an inflow of an external atmosphere.

Figure 2:
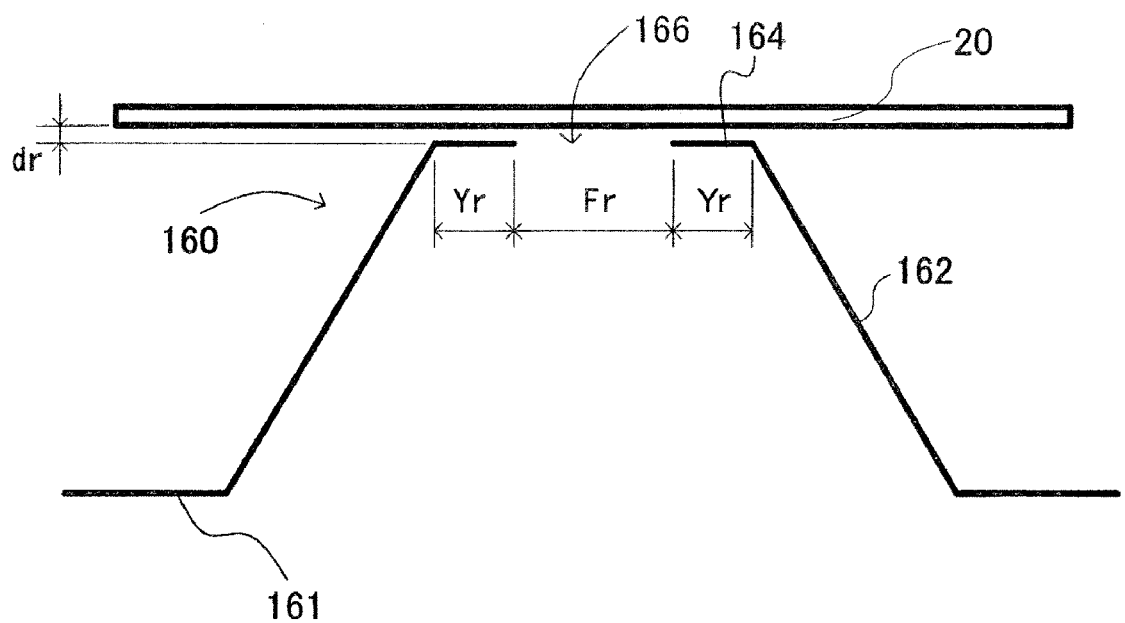
FIG. 2 is a schematic partially enlarged view of a connecting part of the EUV exposure apparatus shown in FIG. 1.

The connecting part 160 decreases an inflow of a contaminant from the accommodating part 140 to the accommodating part 130 by partitioning the accommodating part 130 and the accommodating part 140, and controls the inflow of the contaminant from the accommodating part 140 to the accommodating part 130 by generating a predetermined pressure difference between the both. The connecting part 160 defines the illumination area to the mask 20. The connecting part 160 has a shape to lack an upper part of a pyramid. The connecting part 160 has a convex sectional shape that projects to the mask 20 as shown in FIG. 2, the convex sectional shape includes a horizontal part 161, an inclination part 162, and a projecting part 164 (here, the projecting part is a part that becomes almost parallel for the mask 20 or becomes an angle from −5 to +5 degrees for the surface of the mask 20. Of course, a projecting part 174 described later is a part that becomes almost parallel for the object such as the wafer or becomes an angle from −5 to +5 degrees for the surface of the wafer.). Here, FIG. 2 is a partially enlarged sectional view of the connecting part 160 along a scan direction.

The exposure apparatus 1 is the scanner, and the mask stage 30 drives, then result of the connecting part 160 having the convex sectional shape, the scan exposure executes while only the projecting part 164 is adjacent opposite to the mask 20. Because it has to set an interval with the mask 20 to a predetermined distance dr only within the range of the projecting part 164, an interval control is comparatively easy. On the other hand, if the connecting part 160 defines the opening part 166 by the horizontal part 161, the horizontal part 161 is adjacent opposite to the mask 20. Therefore, it is necessary to set the interval with the mask 20 to the predetermined distance dr for the entire surface of the horizontal part 161, and the interval control is difficult considering a flatness of both.

The inclination part 162 diagonally extends from the horizontal part 161 at a predetermined angle. Although the inclination part 162 extends, in the instant embodiment, symmetrically as shown in FIG. 2, the present invention is not limited to symmetrically. The inclination part 162 extends below as shown in FIGS. 1 and 2. The purpose of this is to limit neither an incident light nor an exit light to the mask 20.

The projecting part 164 symmetrically extends from the inclination part 162 to the mask 20 in almost parallel (in other words, horizontal) in FIG. 2, and defines the opening part 166.

A couple of the projecting part 164 has, in the instant embodiment, an equal length Yr as shown in FIG. 2. In this case, it is necessary to define for the length Yr to generate the predetermined pressure difference. However, if the length Yr is long, the projecting part 164 interferes with the surface of the object 50 and mask 20 by pitching of the stages 30 and 60 when the opening part 166 closes the near of the surface of the object 50 and mask 20. Therefore, it is desirable that the length Yr is short. By setting the length Yr of the projecting part 164 equal length respectively in consideration of the above pressure difference and interference, the predetermined pressure difference can be generated, and the interference of the projecting part 164 and the surface of the object 50 and mask 20 can be suppressed to the minimum. However, in the instant embodiment, a couple of the projecting part 164 need not necessarily have equal length Yr. Even if a couple of the projecting part 164 is not equal length Yr, it only has to be substantially equal. In other words, the other length of a couple of the projecting part may be within the range of 0.9 to 1.1 times, more desirably 0.95 to 1.05 times, of the length Yr of the other projecting part.

A couple of the projecting part 164 sets, in the instant embodiment, the interval with the mask 20 to dr. The projecting part 164 may be not necessarily horizontally bent completely. In other words, the present invention includes the situation that the projecting part 164 inclines, and the situation the projecting part 164 and the inclination part 162 form the curved surface. When the projecting part 164 inclines, the interval dr between the projecting part 164 and the mask 20 is calculated, for example, as an average of the intervals with the mask 20 at each position of the projecting part 164.

A couple of the projecting part 164 reduces a conductance of a channel that the gas from the accommodating part 140 arrives at the accommodating part 130, and enables the form and maintenance of the pressure difference between the accommodating part 130 and accommodating part 140 as described later. The projecting part 164 is formed by almost horizontally bending an edge of the inclination part 162 in the instant embodiment. A setting method for the pressure difference is described later.

The opening part 166 defines the illumination area to illuminate the mask 20, particularity a scan exposure area. The illumination light to illuminate the mask 20 and the diffraction light from the mask 20 pass through the opening part 166. The opening part 166 is formed like the arc shape or rectangle shape that has a predetermined width (in the instant embodiment, Fr). The opening part 166 is the rectangle shape in the instant embodiment. The opening part 166 is closed by a lid (not shown) to maintain the accommodating part 130 to the high vacuum when the mask 20 changes.

Figure 4:
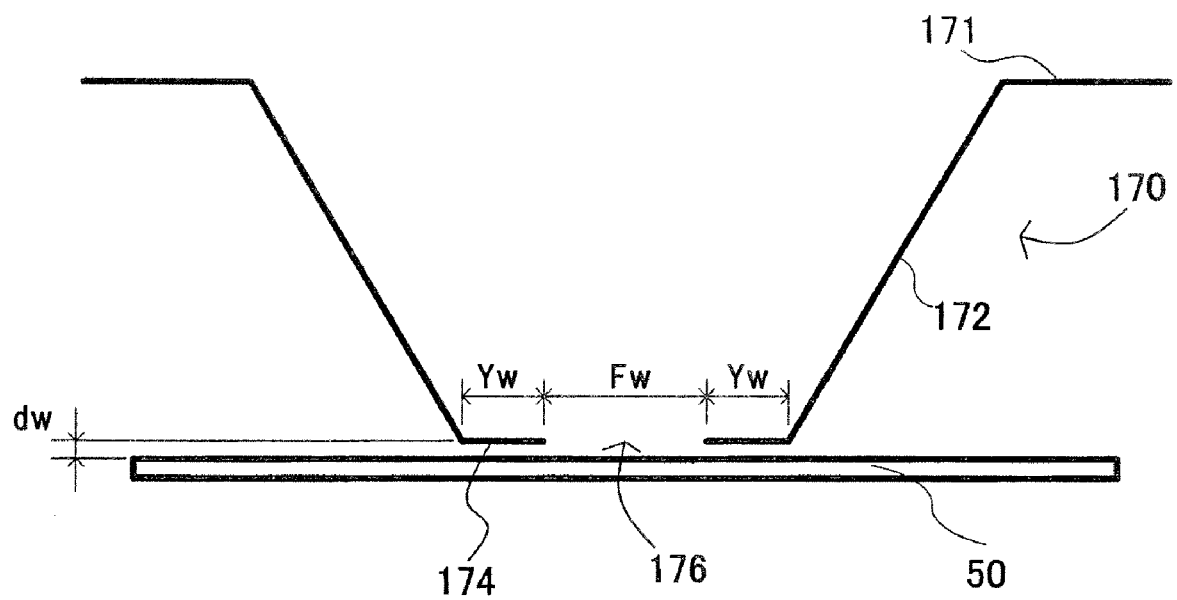
FIG. 4 is a schematic partially enlarged view of another connecting part of the EUV exposure apparatus shown in FIG. 1.

The connecting part 170 decreases an inflow of a contaminant from the accommodating part 150 to the accommodating part 130 by partitioning the accommodating part 130 and the accommodating part 150, and controls the inflow of the contaminant from the accommodating part 150 to the accommodating part 130 by generating a predetermined pressure difference between the both. The connecting part 170 defines an exposure area on the object 50. The connecting part 170 has a shape to lack an upper part of a pyramid. The connecting part 170 has a convex sectional shape that projects to the object 50 as shown in FIG. 4, the convex sectional shape includes a horizontal part 171, an inclination part 172, and a projecting part 174. Here, FIG. 4 is a partially enlarged sectional view of the connecting part 170 along the scan direction.

The exposure apparatus 1 is the scanner, and the wafer stage 60 drives, then result of the connecting part 170 having the convex sectional shape, the scan exposure executes while only the projection part 174 is adjacent opposite to the object 50. Because it has to set an interval with the object 50 to a predetermined distance dw only within the range of the projecting part 174, an interval control is comparatively easy. On the other hand, if the connecting part 170 defines the opening part 176 by the horizontal part 171, the horizontal part 171 is adjacent opposite to the object 50. Therefore, it is necessary to set the interval with the object 50 to the predetermined distance dw for the entire surface of the horizontal part 171, and the interval control is difficult considering a flatness of both.

The inclination part 172 diagonally extends from the horizontal part 171 at a predetermined angle. Although the inclination part 172 extends, in the instant embodiment, symmetrically as shown in FIG. 4, the present invention is not limited to symmetrically. The inclination part 172 extends for above as shown in FIGS. 1 and 4. The purpose of this is not to limit the exposure light to the object 50.

The projecting part 174 symmetrically extends from the inclination part 172 to the object 50 in almost parallel (in other words, horizontal) in FIG. 4, and defines the opening part 176. A couple of the projecting part 174 has, in the instant embodiment, an equal length Yw as shown in FIG. 4, but the present invention need not necessarily have the equal length Yw.

A couple of the projecting part 174 sets, in the instant embodiment, the interval with the object 50. The projecting part 174 may be not necessarily horizontally bent completely. In other words, the present invention includes the situation that the projecting part 174 inclines, and the situation that the projecting part 174 and the inclination part 172 form the curved surface. When the projecting part 174 inclines, the interval dw between the projecting part 174 and the object 50 is calculated, for example, as an average of the interval with the object 50 at each positions of the projecting part 174.

A couple of the projecting part 174 reduces a conductance of a channel that the gas from the accommodating part 150 arrives at the accommodating part 130, and enables the form and maintenance of the pressure difference between the accommodating part 130 and the accommodating part 150 as described later. The projecting part 174 is formed by almost horizontally bending an edge of the inclination part 172 in the instant embodiment. A setting method for the pressure difference is described later.

The opening part 176 defines the scan exposure area on the object 50. The exposure light to expose the object 50 passes through the opening part 176. The opening part 176 is formed like the arc shape or rectangle shape that has a predetermined width (in the instant embodiment, Fw). The opening part 176 is the rectangle shape in the instant embodiment. The opening part 176 is closed by a lid (not shown) to maintain the accommodating part 130 to the high vacuum when the object 50 changes.

The pressure control apparatus 200 controls or exhausts the pressure of each accommodating parts of the vacuum chamber 100. The pressure control apparatus 200 includes a controller 210, an exhaust apparatus 220, and a pressure detector 280.

The controller 210 controls an exposure timing and a carry out operation of mask 20 and object 50 based on a pressure information of the accommodating part detected by the pressure detector 280, and warns an abnormal pressure. The pressure detector 280 is composed of pressure sensors that measures the pressure of each accommodating parts, and is arranged in the accommodating parts 130, 140 and 150.

The exhaust apparatus 220 exhausts the accommodating part that corresponds by always max power to the vacuum. The exhaust apparatus 220 includes exhaust parts 221 to 226, the exhaust parts are respectively connect with accommodating parts 110, 112, 114, 130, 140 and 150, and exhaust these accommodating parts. For example, each exhaust parts are composed of a turbo-molecular pump, and have an exhaust velocity of 10 m$^3$/sec or more.

The inventor discovers each internal pressure of the accommodating parts 140 and 150 to be adjusted only to about $10^{-4}$ Pa with highest even if the exhaust parts 225 and 226 are arranged in the accommodating parts 140 and 150 to generate the escape gas including the molecule including the carbon from the stage and the moving mechanism. It is necessary to lower the pressures of the accommodating parts 140 and 150 more than the pressure of the accommodating part 130 to completely prevent the influence of the escape gas, but the inventor discovers that such a composition is difficult from the performance of the exhaust parts 140 and 150. However, if pressure lowers any further, a generated amount of the escape gas is expected to increase. Therefore, it is undesirable to form the high vacuum to the accommodating parts 140 and 150 any further.

Then, the inventor examined that the pressure difference is formed among respectively of the accommodating parts 130, 140 and 150, and the pressure difference decreases the influence of the pollution of the optical system by the escape gas. As above-mentioned, it is necessary to adjust the partial pressure of the molecule including the carbon of the exposure optical path to at least $10^{-6}$ Pa or less, desirably $10^{-7}$ Pa or less, to prevent the carbon adhesion. Then, an expressions 1 and 2 is met, where the pressure of the accommodating parts 140 and 150 is Ps and the pressure of the accommodating part 130 Po, because the minimum value of Ps is about $10^{-4}$ Pa (it is desirable that $Ps \leq 10^{-3}$ Pa) and Po needs $10^{-6}$ Pa or less, desirably $10^{-7}$ Pa or less.

$$Ps/Po \geq 100 \quad (1)$$

Desirably $$Ps/Po \geq 1000 \quad (2)$$

Thereby, the optical system in the accommodating part 130 can be protected from the pollution of the escape gas. The controller 210 warns to a user through a lamp and speaker (not shown) if judges that the above relationship is not satisfied at exposing based on the result of the pressure detector 280. The controller 210 permits the exposure start if judges the above relationship is satisfied. The controller 210 permits the open of the change doors 142 and 152 if judges the pressure of the accommodating parts 140 and 150 is the atmospheric pressure at changing.

Figure 3:
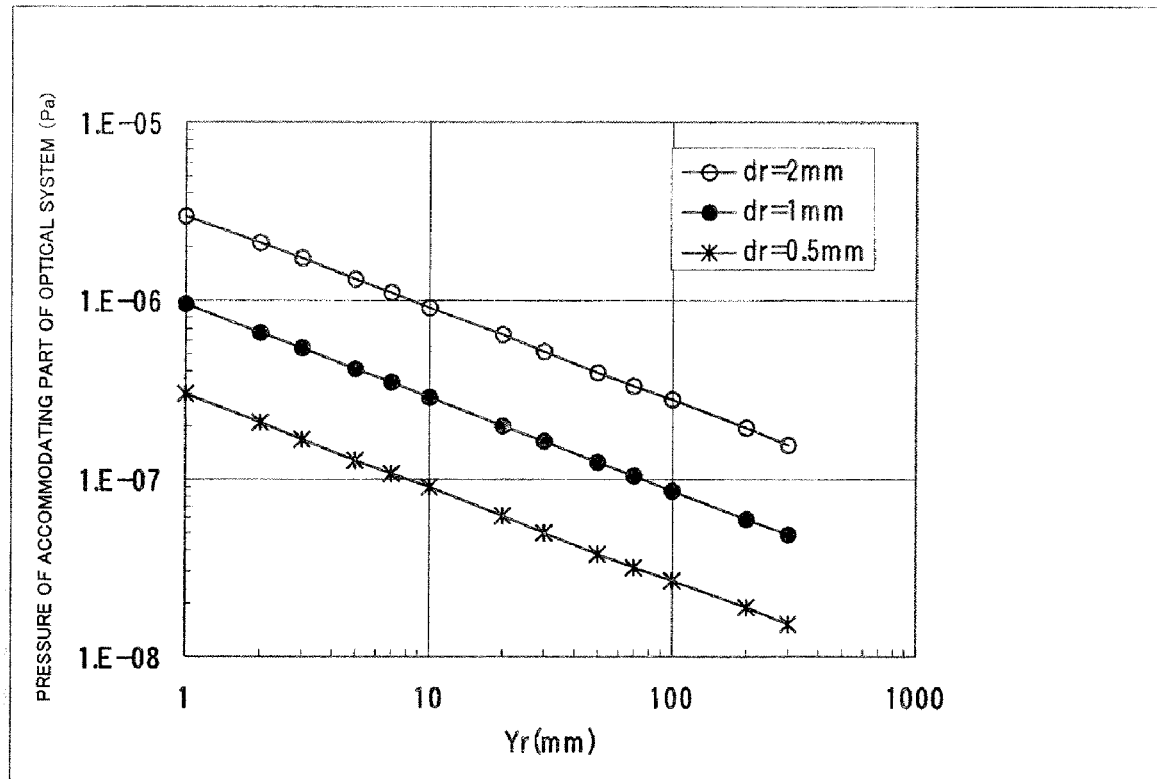
FIG. 3 is a graph that shows a relationship between a projecting part of an accommodating part shown in FIG. 2 and an inside pressure.

Referring to FIGS. 2 and 3, a description will be given of a setting of length Yr of the projecting part 162 of the accommodating part 140, and a setting of the interval between the connecting part 160 and the mask 20 and the pressure of the accommodating part 130. Here, FIG. 3 is a graph that shows a relationship between the projecting part 164 of the accommodating part 140 and the internal pressure of the accommodating part 130.

First, these settings simulate using DSMC (Direct Simulation Monte Carlo) method, and select a value with the highest internal pressure of the accommodating part 130.

An opening of the opening part 166 is assumed to be a circular shape, and a diameter is assumed to be Fr. Moreover, a distance between the mask 20 and a part of the projecting part 164 that is the nearest the mask 20 is assumed to be dr (here, an area that an average of distance with the mask 20 is dr or less is called the projecting part), and a width of one of the projecting part of a couple of the projecting part 164 installed on both side of the scan direction for the opening part is assumed to be Yr (here, the length of the projecting part installed on both sides of the opening part is substantially assumed to be equal each other). In this case, an exposure size on the exposure surface of the mask 20 is assumed to be about 20 mm×100 mm, the diameter Fr sets to 50.5 mm to be same area as the exposure size (In other words, an opening area on the exposure surface of the mask is set to be 2000 mm² or more of the area of the exposure size). The exhaust velocity of the exhaust apparatus 225 connected to the accommodating part 140 and the exhaust apparatus 224 connected to the accommodating part 130 is assumed to 10 m³/sec.

In the instant embodiment, a desired pressure is set to be $10^{-9}$ Pa at the accommodating part 130, and is set to be $10^{-4}$ Pa at the accommodating part 140. In this case, how the pressure of the accommodating part 130 changes is examined according to the value of Yr of dr=0.5 mm, 1 mm, and 2 mm. FIG. 3 shows the result. FIG. 3 adopts Yr (mm) for a lateral axis, and pressure (Pa) of the accommodating part 130 for a longitudinal axis. As a result, it is necessary to satisfy Yr≧8 mm at dr≦2 mm (2Yr that is the length of the projecting part in the scan direction≧16 mm), or Yr≧1 mm at dr≦1 mm (2Yr≧2 mm) to maintain the pressure of the optical path space to $10^{-6}$ Pa or less. Next, it is necessary to satisfy Yr≧74 mm at dr≦1 mm (2Yr≧148 mm), or Yr≧7 mm at dr≦0.5 mm (2Yr≧14 mm) to desirably maintain the pressure of the optical path space to $10^{-7}$ Pa or less.

An opening size is a slit shape similar to the exposure size originally, but is set like the circular shape in this calculation to simplify the model of the simulation. The slit shape easily generates the pressure difference because the conductance is usually small compared with the circular shape. The pressure in the optical path space can be maintained to the predetermined pressure for the opening of the slit shape in the same area under the above condition.

The pressure difference might not be able to be maintained by existing a difference etc. around the mask 20. Therefore, a height adjusting member to satisfy the above condition is arranged around the mask 20, and it may be composes as satisfy the above condition during the exposure by using around the mask.

Figure 5:
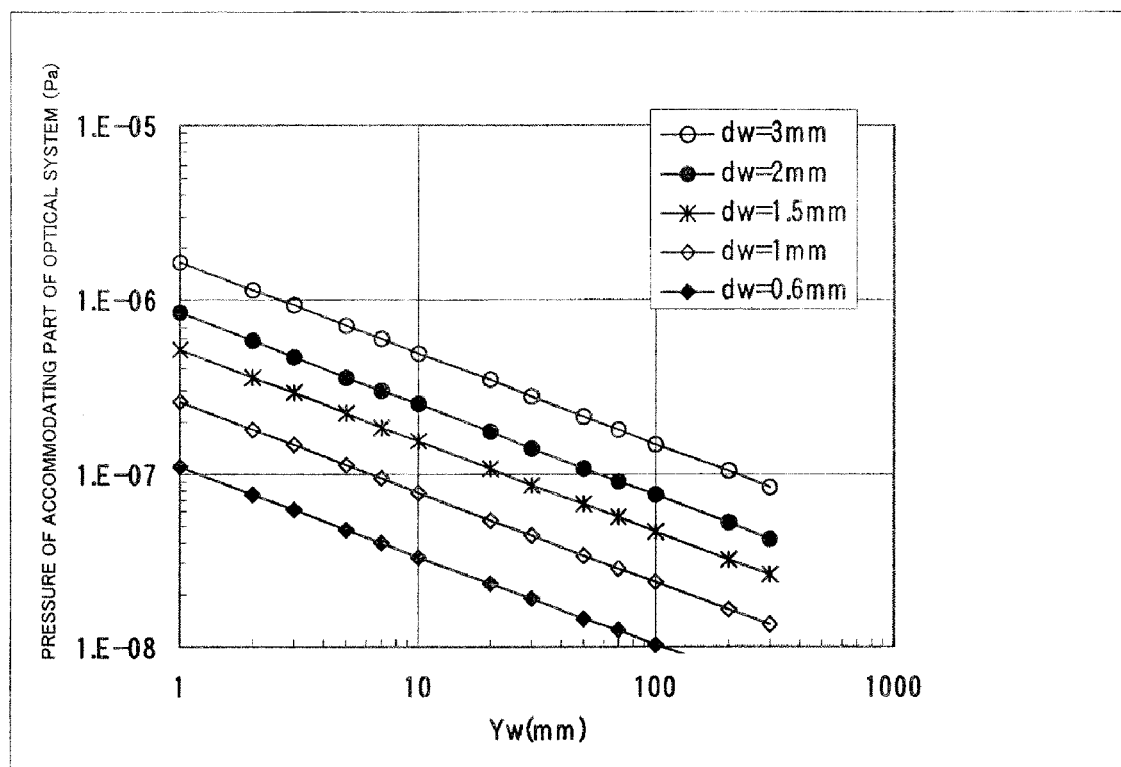
FIG. 5 is a graph that shows a relationship between a projecting part of an accommodating part shown in FIG. 4 and an inside pressure.

Referring to FIGS. 4 and 5, a description will be given of a setting of length Yw of the projecting part 174 of the accommodating part 150, and a setting of the interval between the connecting part 170 and the object 50 and the pressure of the accommodating part 130. Here, FIG. 5 is a graph that shows a relationship between the projecting part 174 of the accommodating part 150 and the internal pressure of the accommodating part 130.

These settings simulate using DSMC (Direct Simulation Monte Carlo) method, and select a value with the highest internal pressure of the accommodating part 130 similar to the above-mentioned.

An opening of the opening part 176 is assumed to be a circular shape, and a diameter is assumed to be Fw (Of course, it is acceptable excluding the circular shape. It is assumed to a diameter of a circle that has the same area for the circular shape). Moreover, a distance between the object 50 and a part of the projecting part 174 that is the nearest the object 50 is assumed to be dw (here, an area that an average of distance with the object 50 is dw or less is called the projecting part), and a width of one of the projecting part of a couple of the projecting part 174 installed on both side of the scan direction for the opening part is assumed to be Yw (here, the length of the projecting part installed on both sides of the opening part is substantially assumed to be equal each other). In this case, an exposure size on the exposure surface of the object 50 is assumed to be about 5 mm×25 mm, the diameter Fw sets to 12.6 mm to be same area as the exposure size (In other words, an opening area is set to be 125 mm² or more of the area of the exposure size on the object surface). The exhaust velocity of the exhaust apparatus 226 connected to the accommodating part 150 and the exhaust apparatus 224 connected to the accommodating part 130 is assumed to 10 m³/sec.

In the instant embodiment, a desired pressure is set to be $10^{-9}$ Pa at the accommodating part 130, and is set to be $10^{-4}$ Pa at the accommodating part 150. In this case, how the pressure of the accommodating part 130 changes is examined according to the value of Yw of dw=0.6 mm, 1 mm, 1.5 mm, 2 mm and 3 mm. FIG. 5 shows the result. FIG. 5 adopts Yw (mm) for a lateral axis, and pressure (Pa) of the accommodating part 130 for a longitudinal axis. As a result, it is necessary to satisfy Yw≧2.6 mm at dw≦3 mm (2Yw that is the length of the projecting part in the scan direction≧5.2 mm), or Yw≧1 mm at dw≦2 mm (2Yw≧2 mm) to maintain the pressure of the accommodating part 130 to $10^{-6}$ Pa or less. Next, it is necessary to satisfy Yw≧57 mm at dw≦2 mm (2Yw≧114 mm), Yw≧22 mm at dr≦1.5 mm (2Yw≧44 mm), Yw≧6 mm at dw≦1 mm (2Yw≧12 mm), or Yw≧1 mm at dw≦0.6 mm (2Yw≧2 mm) to desirably maintain the pressure of the accommodating part 130 to $10^{-7}$ Pa or less.

As above-mentioned, an opening size is a slit shape similar to the exposure size originally, but is set like the circular shape in this calculation to simplify the model of the simulation. The slit shape easily generates the pressure difference because the conductance is usually small compared with the circular shape. The pressure in the accommodating part can be maintained to the predetermined pressure for the opening of the slit shape in the same area under the above condition.

The exposure size on the exposure surface of the mask is assumed to be about 20 mm×100 mm (area: 2000 mm²) in above-mentioned, but it is possible to apply to a different exposure size. For example, when the area of the exposure size on the exposure surface of the mask is assumed to be 100 to 300 mm², the lateral axis of FIG. 5 can be replace with Yr (mm). In other words, when the area of the exposure size on the exposure surface of the mask is assumed to be 100 to 300 mm², it is necessary to satisfy Yr≧2.6 mm at dr≦3 mm (2Yr that is the length of the projecting part in the scan direction≧5.2 mm), or Yr≧1 mm at dr≦2 mm (2Yr≧2 mm) to maintain the pressure of the accommodating part 130 to $10^{-6}$ Pa or less.

The pressure difference might not be able to be maintained by existing a difference etc. around the object 50. Therefore, a height adjusting member to satisfy the above condition is arranged around the object 50, and it may be composes as satisfy the above condition during the exposure by using around the object 50.

A fabrication method of the exposure apparatus 1 can fabricate the vacuum chamber 100 of the instant embodiment by using the above setting method for the length Yr of the projecting part 164 of the accommodating part 140, the interval between the connecting part 160 and the mask 20, the pressure of the accommodating part 130, the length Yw of the projecting part 174 of the accommodating part 150, and the interval between the connecting part 170 and the object 50, and the exposure apparatus 1 of the present invention can be fabricated by combining with the fabrication method of the conventional exposure apparatus. As a result, the exposure apparatus that easily improves both the resolution and productivity can be fabricated.

Figure 6:
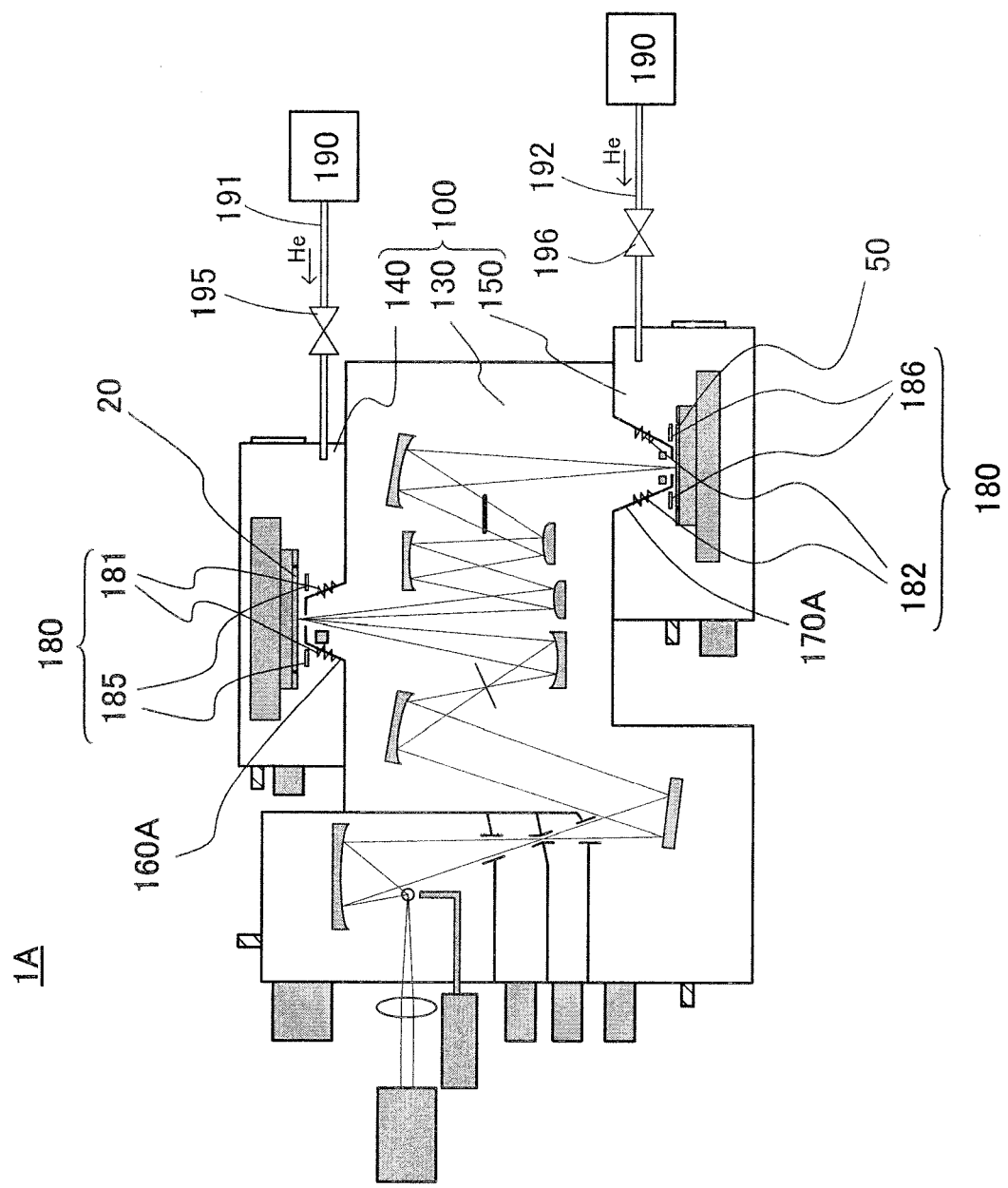
FIG. 6 is a schematic sectional view of an EUV exposure apparatus of another embodiment shown in FIG. 1.

Referring to FIG. 6, a description will be given of an exposure apparatus 1A that is another embodiment of the exposure apparatus 1. Here, FIG. 6 is a structure of the exposure apparatus 1A. The above embodiment is the method that prevents the inflow of the contaminant existed in the accommodating parts 140 and 150 to the accommodating part 130. On the other hand, the instant embodiment relates a method for suppressing the adhesion of the particle existed in the accommodating parts 130 to 150 to the surface of the mask 20 and object 50. The exposure apparatus 1A of the instant embodiment is the same as the structure of the exposure apparatus 1, but a connecting parts 160A and 170A are different from the connecting parts 160 and 170 of the exposure apparatus 1. The exposure apparatus 1A further includes a cooling mechanism 180 and a supply part 190. Therefore, a description will be given of only the cooling mechanism 180 and the supply part 190.

The connecting part 160A decreases an inflow of the contaminant from the accommodating part 140 to the accommodating part 130 by partitioning the accommodating part 130 and the accommodating part 140, and controls the inflow of the contaminant from the accommodating part 140 to the accommodating part 130 by generating a predetermined pressure difference between the both. The connecting part 160A defines the illumination area to the mask 20. The connecting part 160A has, for example, a shape to lack an upper part of a pyramid. The connecting part 160A is composed of a material such as resin and ceramic with low thermal conductivity in the instant embodiment. The composition of other connecting part 160A is the same as the connecting part 160, and the explanation is omitted.

The connecting part 170A decreases an inflow of the contaminant from the accommodating part 150 to the accommodating part 130 by partitioning the accommodating part 130 and the accommodating part 150, and controls the inflow of the contaminant from the accommodating part 150 to the accommodating part 130 by generating a predetermined pressure difference between the both. The connecting part 170A defines an exposure area on the object 50. For example, the connecting part 170A has a shape to lack an upper part of a pyramid. The connecting part 170A is composed of a material such as resin and ceramic with low thermal conductivity in the instant embodiment. The composition of other connecting part 170A is the same as the connecting part 170, and the explanation is omitted.

The cooling mechanism 180 cools a temperature in the accommodating part, and includes a first cooling mechanism 181 and 182, and a second cooling mechanism 185 and 186.

The first cooling mechanism 181 is arranged at a position opposed to the mask 20 of the connecting part 160A. The first cooling mechanism 181 connects to a pipe of a cooling water and Peltier element (not shown) etc., and cools to a constant temperature. Generally, a temperature of an area on the mask 20 that the exposure light is irradiated rises by an exposure heat, and rises more than the temperature of the connecting part 160A. Then, a temperature difference is caused between the connecting part 160A and the mask 20 during exposing. Therefore, the first cooling mechanism 181 is installed to be the temperature difference constant. Moreover, the mask 20 is controlled so that the temperature may constant usually, but the first cooling mechanism 181 may control the temperature of the mask 20. The first cooling mechanism 181 may individually control the temperature of the mask 20, and may set the temperature of the connecting part 160A at a temperature that is lower than the preset temperature.

The first cooling mechanism 182 is arranged at a position opposed to the object 50 of the connecting part 170A. The first cooling mechanism 182 connects to a pipe of a cooling water and Peltier element (not shown) etc., and cools to a constant temperature. Generally, a temperature of an area on the object 50 that the exposure light is irradiated rises by an exposure heat, and rises more than the temperature of the connecting part 170A. Then, a temperature difference is caused between the connecting part 170A and the object 50 during exposing. Therefore, the first cooling mechanism 182 is installed to be the temperature difference constant. Moreover, the object 50 is controlled so that the temperature may constant usually, but the first cooling mechanism 182 may control the temperature of the object 50. The first cooling mechanism 182 may individually control the temperature of the object 50, and may set the temperature of the connecting part 170A at a temperature that is lower than the preset temperature.

The second cooling mechanism 185 is arranged at a position near the connecting part 160A. The second cooling mechanism 185 connects to a pipe of a cooling water and Peltier element (not shown) etc., and cools to a constant temperature. The second cooling mechanism 185 can suppress the adhesion of the particle to the mask and wafer in wider area by cooling as well as the first cooling mechanism 181.

The second cooling mechanism 186 is arranged at a position near the connecting part 170A. The second cooling mechanism 186 connects to a pipe of a cooling water and Peltier element (not shown) etc., and cools to a constant temperature. The second cooling mechanism 186 can suppress the adhesion of the particle to the mask and wafer in wider area by cooling as well as the first cooling mechanism 181.

The instant embodiment shows a structure that achieves the suppressing effect of the particle for both of the object 50 and the mask 20, but the improvement of the productivity can be achieved by executing the present invention to either at least.

The supply part 190 introduces a gas into the accommodating part, and includes a duct 191 and 192, and a valve 195 and 196. Concretely, the supply part 190 introduces an inert gas such as He that has high transmittance for the EUV light or hydrogen into the chamber though the duct 191 and 192, and the valve 195 and 196. In this case, each accommodating parts may be set to at least 5 Pa or more to achieve the effect of heat migration to suppress the particle.

Moreover, a projection optical system space is set to pressure that is lower then the stage space to maintain high transmittance in the space.

The setting of such pressure condition can be achieved by locating the connecting part 160A and 170A, and the retice 20 and the object 50 close to the predetermined position as explained by the above embodiment.

Such setting can suppress the particle adhesion to the mask 20 and object 50 by the heat migration.

The duct 191 and 192 lead the gas from the supply part 190 to the accommodating part 140 and 150, and is coupled to the supply part 190 and the accommodating part 140 and 150. The leaded gas is the above inert gas such as He or hydrogen. The duct 191 is coupled to the supply part 190 and the accommodating part 140, and the duct 192 is coupled to the supply part 190 and the accommodating part 150. Therefore, because the accommodating part 140 and 150 are formed independently of the duct 191 and 192, the gas flow can be changed respectively.

The valve 195 and 196 is used to adjust a flow rate of the gas, and is arranged in the duct 191 and 192. The valve 195 is arranged in the duct 191, and the valve 196 is arranged in the duct 192. Therefore, the accommodating part 140 and 150 can change the flow rate of the gas by the valve 195 and 196 respectively.

In exposure, the EUV light emitted from the illumination apparatus 10 illuminates the mask 20 by the optical element arranged in the vacuum environment, and images the pattern of the mask 20 onto the object 50 surface. The instant embodiment uses an arc or ring shaped image plane, scans the mask 20 and object 50 at a speed ratio corresponding to a reduction rate to expose the entire surface of the mask 20. The exposure apparatus 1 of the instant embodiment can maintain the inside of the accommodating part 130 to Ps/Po≧100, Ps≦$10^{-3}$ Pa by the above structure. In this pressure, because the molecular density is low, the possibility of adhering to the optical element of the optical system, and a decrease and irregularity of the light intensity by the adhesion amount can be disregarded for the optical performance (the resolution and throughput) of the exposure apparatus, then the exposure apparatus 1 can suppress the attenuation of the exposure light. As a result, the exposure apparatus 1 can improve the throughput, the resolution and productivity.

Figure 7:
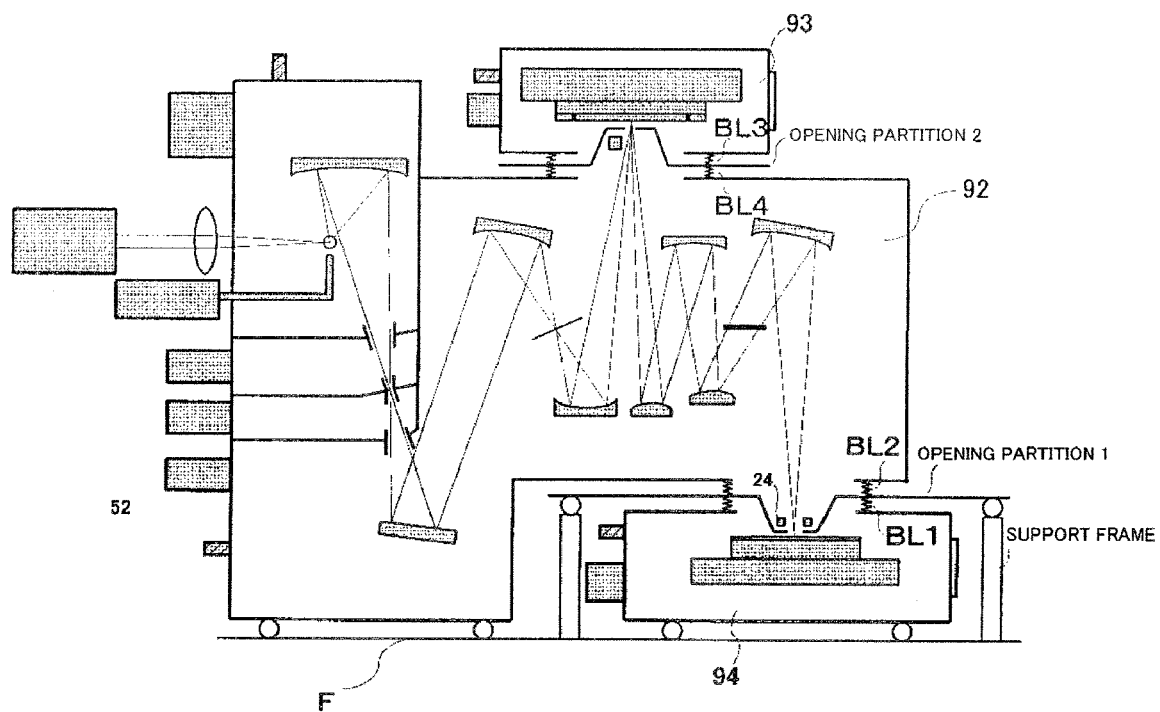
FIG. 7 is a schematic sectional view of an EUV exposure apparatus of another embodiment shown in FIG. 1.

In addition, another embodiment is shown in FIG. 7. An opening partition 1 connects to a wafer stage chamber 94 through a bellows BL1, and connects to a chamber 92 that accommodates the projection optical system through a bellows BL2. The opening partition 1 is fixed to a floor surface F by a support frame, and can suppress an influence of a vibration when a differential pumping is composed by the separate supporting the each chambers and the opening partition 1.

The transfer amount of the vibration from the wafer stage chamber 94 to the chamber 92 that accommodates the projection optical system can be decreased even if there are not either the bellows BL1 and the bellows BL2.

Similarly for the mask side, an opening partition 2 connects to a mask stage chamber 93 through a bellows BL3, and connects to the chamber 92 that accommodates the projection optical system through a bellows BL4. The opening partition 2 is fixed to the floor surface F by a support frame (not shown), and the mask stage chamber 93 is fixed to the floor surface F by a support frame (not shown). Therefore, the influence of the vibration when the differential pumping is composed can be suppressed by the separate supporting the each chambers and the opening partition 2.

The transfer amount of the vibration from the mask stage chamber 93 to the chamber 92 that accommodates the projection optical system can be decreased even if there are not either the bellows BL3 and the bellows BL4.

Figure 8:
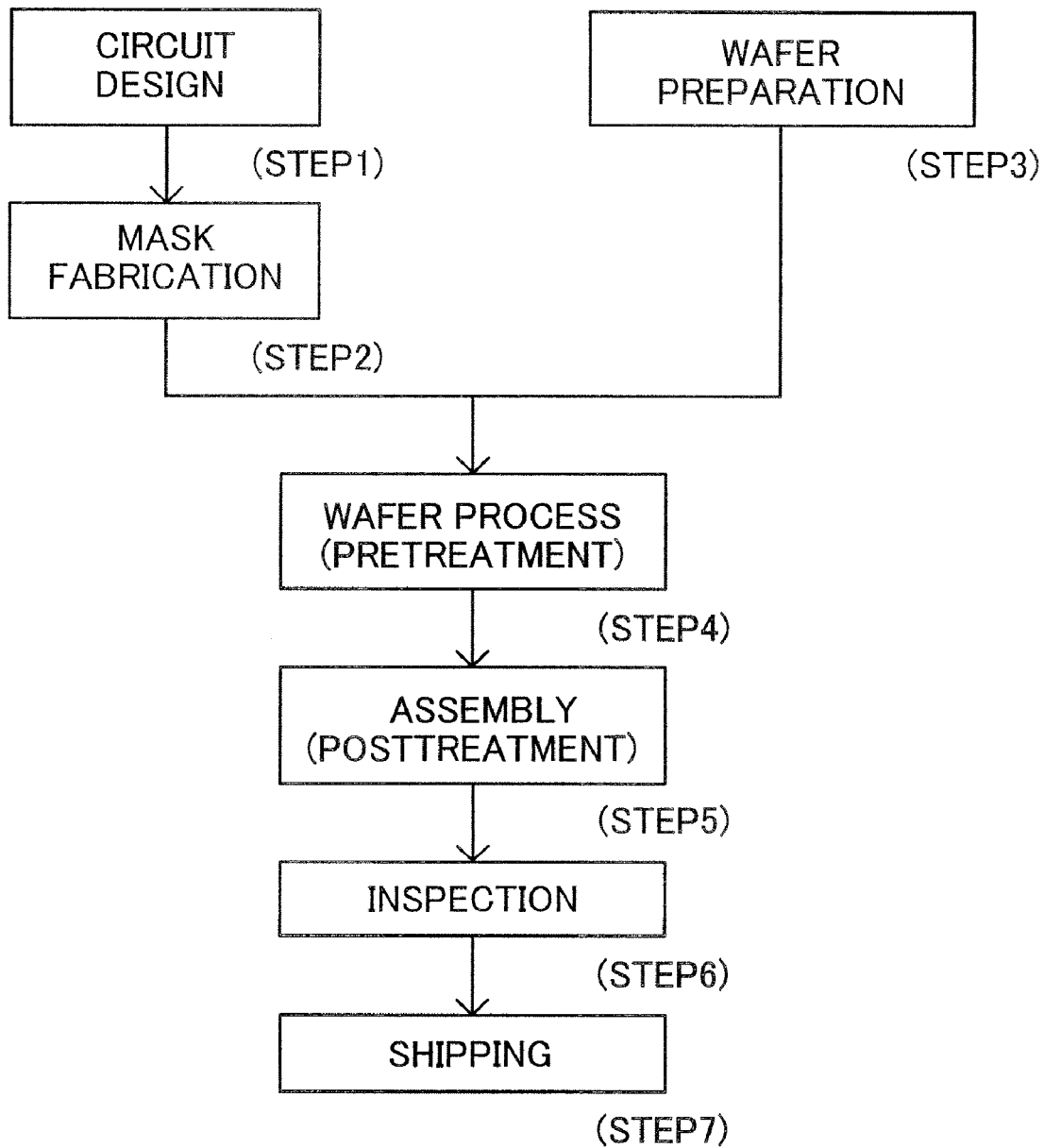
FIG. 8 is a flowchart for explaining how to fabricate devices (such as semiconductor chips such as ICs, LCDs, CCDs, and the like).
Figure 9:
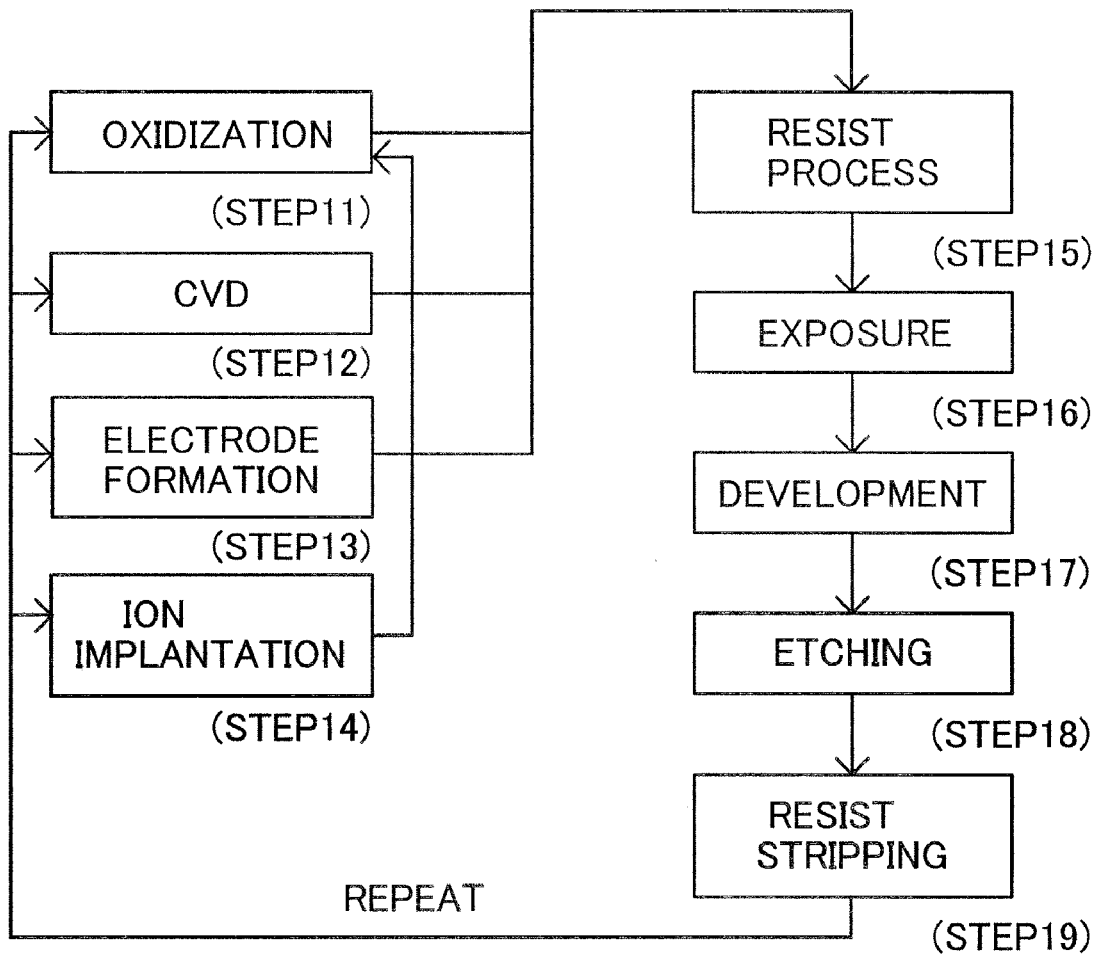
FIG. 9 is a detail flowchart of a wafer process in Step 4 of FIG. 8.

Referring now to FIGS. 8 and 9, a description will be given of an embodiment of a device fabrication method using the above mentioned exposure apparatus 1. FIG. 8 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 9 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 300 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one, because the exposure can be executed in the environment with a little pollution of the optical system.

Thus, the instant embodiment can provide the exposure apparatus that easily improves both the resolution and productivity.

Furthermore, the present invention is not limited to these preferred embodiments and various variations and modifications may be made without departing from the scope of the present invention. Although the pressure difference is set in consideration of only the escape gas from the stage and the moving mechanism, the pressure of the accommodating part 150 is set lower than the pressure of the accommodating part 140 aiming to decrease the pollution of the optical element with the organism generated from the resist of the object 50, and the condition of the pressure difference is changed. The pressure condition in this case should set the pressure of several Pa or more to the projection optical system space.

This application claims a benefit of a foreign priority based on Japanese Patent Applications Nos. 2004-197269, filed on Jul. 2, 2004, and 2005-085663, filed on Mar. 24, 2005, each of which is hereby incorporated by reference herein in its entirety as if fully set forth herein.

What is claimed is:

1. An exposure apparatus comprising:
a projection optical system for projecting a pattern of a mask onto an object using a light with wavelength of 20 nm or less from a light source;
a first accommodating part for accommodating the projection optical system;
a second accommodating part for accommodating one of the mask or the object, said first and second accommodating parts having different pressures; and
a connecting part for defining an opening part that connects said first and second accommodating parts to each other,
wherein an equation Ps/Po=1000 is met, where Po is the pressure of the first accommodating part, and Ps is the pressure of the second accommodating part,
wherein said exposure apparatus transfers the pattern onto the object by scanning the mask and the object in a scan direction,
wherein said connecting part has a convex section that projects toward the one of the mask or the object which is accommodated by said second accommodating part, and the convex section includes a projecting part that bends in the scan direction, and defines the opening part, and
wherein said opening part has an area of 125 mm$^2$ or more, an average distance between the one of the mask or the object which is accommodated by said second accommodating part and the projecting part is 2 mm or less, and a length of the projecting part in the scan direction is 114 mm or more.

2. An exposure apparatus comprising:
a projection optical system for projecting a pattern of a mask onto an object using a light with wavelength of 20 nm or less from a light source;

a first accommodating part for accommodating the projection optical system;

a second accommodating part for accommodating one of the mask or the object, said first and second accommodating parts having different pressures; and a connecting part for defining an opening part that connects said first and second accommodating parts to each other, wherein an equation Ps/Po=1000 is met, where Po is the pressure of the first accommodating part, and Ps is the pressure of the second accommodating part, wherein said exposure apparatus transfers the pattern onto the object by scanning the mask and the object in a scan direction, wherein said connecting part has a convex section that projects toward the one of the mask or the object which is accommodated by said second accommodating part, and the convex section includes a projecting part that bends in the scan direction, and defines the opening part, and wherein a pair of projecting parts projects toward the opening part and have substantially the same length in the scan direction.

3. An exposure apparatus comprising:

a projection optical system for projecting a pattern of a mask onto an object using a light with wavelength of 20 nm or less from a light source;

a first accommodating part for accommodating the projection optical system;

a second accommodating part for accommodating one of the mask or the object, said first and second accommodating parts having different pressures; and a connecting part for defining an opening part that connects said first and second accommodating parts to each other, wherein an equation Ps/Po=1000 is met, where Po is the pressure of the first accommodating part, and Ps is the pressure of the second accommodating part, wherein said exposure apparatus transfers the pattern onto the object by scanning the mask and the object in a scan direction, wherein said connecting part has a convex section that projects toward the one of the mask or the object which is accommodated by said second accommodating part, and the convex section includes a projecting part that bends in almost parallel to the one of the mask or the object which is accommodated by said second accommodating part, and defines the opening part, and wherein said opening part of the connecting part has an area of 125 mm$^2$ or more, an average distance between the one of the mask or the object which is accommodated by said second accommodating part and the projecting part is 1.5 mm or less, and a length of the projecting part in the scan direction is 44 mm or more.

4. An exposure apparatus comprising:

a projection optical system for projecting a pattern of a mask onto an object using a light with wavelength of 20 nm or less from a light source;

a first accommodating part for accommodating the projection optical system;

a second accommodating part for accommodating one of the mask or the object, said first and second accommodating parts having different pressures; and a connecting part for defining an opening part that connects said first and second accommodating parts to each other, wherein an equation Ps/Po=1000 is met, where Po is the pressure of the first accommodating part, and Ps is the pressure of the second accommodating part, wherein said exposure apparatus transfers the pattern onto the object by scanning the mask and the object in a scan direction, wherein said connecting part has a convex section that projects toward the one of the mask or the object which is accommodated by said second accommodating part, and the convex section includes a projecting part that bends in almost parallel to the one of the mask or the object which is accommodated by said second accommodating part, and defines the opening part, and wherein said opening part of the connecting part has an area of 125 mm$^2$ or more, an average distance between the one of the mask or the object which is accommodated by said second accommodating part and the projecting part is 1 mm or less, and a length of the projecting part in the scan direction is 12 mm or more.

5. An exposure apparatus comprising:

a projection optical system for projecting a pattern of a mask onto an object using a light with wavelength of 20 nm or less from a light source;

a first accommodating part for accommodating the projection optical system;

a second accommodating part for accommodating one of the mask or the object, said first and second accommodating parts having different pressures; and a connecting part for defining an opening part that connects said first and second accommodating parts to each other, wherein an equation Ps/Po=1000 is met, where Po is the pressure of the first accommodating part, and Ps is the pressure of the second accommodating part, wherein said exposure apparatus transfers the pattern onto the object by scanning the mask and the object in a scan direction, wherein said connecting part has a convex section that projects toward the one of the mask or the object which is accommodated by said second accommodating part, and the convex section includes a projecting part that bends in almost parallel to the one of the mask or the object which is accommodated by said second accommodating part, and defines the opening part, and wherein said opening part of the connecting part has an area of 125 mm$^2$ or more, an average distance between the one of the mask or the object which is accommodated by said second accommodating part and the projecting part is 0.6 mm or less, and a length of the projecting part in the scan direction is 2 mm or more.

6. An exposure apparatus comprising:

a projection optical system for projecting a pattern of a mask onto an object using a light with wavelength of 20 nm or less from a light source;

a first accommodating part for accommodating the projection optical system;

a second accommodating part for accommodating one of the mask or the object, said first and second accommodating parts having different pressures; and a connecting part for defining an opening part that connects said first and second accommodating parts to each other, wherein an equation Ps/Po=1000 is met, where Po is the pressure of the first accommodating part, and Ps is the pressure of the second accommodating part, wherein said exposure apparatus transfers the pattern onto the object by scanning the mask and the object in a scan direction, wherein said connecting part has a convex section that projects toward the mask, and the convex section includes a projecting part that bends in almost parallel to the mask, and defines the opening part, and wherein said opening part of the connecting part has an area of 2000 mm² or more, an average distance between the mask and the projecting part is 1 mm or less, and a length of the projecting part in the scan direction is 148 mm or more.

7. An exposure apparatus comprising:
a projection optical system for projecting a pattern of a mask onto an object using a light with wavelength of 20 nm or less from a light source;
a first accommodating part for accommodating the projection optical system;
a second accommodating part for accommodating one of the mask or the object, said first and second accommodating parts having different pressures; and
a connecting part for defining an opening part that connects said first and second accommodating parts to each other,
wherein an equation Ps/Po=1000 is met, where Po is the pressure of the first accommodating part, and Ps is the pressure of the second accommodating part,
wherein said exposure apparatus transfers the pattern onto the object by scanning the mask and the object in a scan direction,
wherein said connecting part has a convex section that projects toward the mask, and the convex section includes a projecting part that bends in almost parallel to the mask, and defines the opening part, and
wherein said opening part of the connecting part has an area of 2000 mm² or more, an average distance between the mask and the projecting part is 0.5 mm or less, and a length of the projecting part in the scan direction is 14 mm or more.

8. An exposure apparatus comprising:
a projection optical system for projecting a pattern of a mask onto an object using a light with wavelength of 20 nm or less from a light source;
a first accommodating part for accommodating the projection optical system;
a second accommodating part for accommodating one of the mask or the object, said first and second accommodating parts having different pressures; and
a connecting part for defining an opening part that connects said first and second accommodating parts to each other,
wherein an equation Ps/Po=100 is met, where Po is the pressure of the first accommodating part, and Ps is the pressure of the second accommodating part,
wherein said exposure apparatus transfers the pattern onto the object by scanning the mask and the object in a scan direction,
wherein said connecting part has a convex section that projects toward the one of the mask or the object which is accommodated by said second accommodating part, and the convex section includes a projecting part that bends in almost parallel to the one of the mask or the object which is accommodated by said second accommodating part, and defines the opening part, and
wherein said opening part of the connecting part has an area of 125 mm² or more, an average distance between the one of the mask or the object which is accommodated by said second accommodating part and the projecting part is 3 mm or less, and a length of the projecting part in the scan direction is 5.2 mm or more.

9. An exposure apparatus comprising:
a projection optical system for projecting a pattern of a mask onto an object using a light with wavelength of 20 nm or less from a light source;
a first accommodating part for accommodating the projection optical system;
a second accommodating part for accommodating one of the mask or the object, said first and second accommodating parts having different pressures; and
a connecting part for defining an opening part that connects said first and second accommodating parts to each other,
wherein an equation Ps/Po=100 is met, where Po is the pressure of the first accommodating part, and Ps is the pressure of the second accommodating part,
wherein said exposure apparatus transfers the pattern onto the object by scanning the mask and the object in a scan direction,
wherein said connecting part has a convex section that projects toward the one of the mask or the object which is accommodated by said second accommodating part, and the convex section includes a projecting part that bends in almost parallel to the one of the mask or the object which is accommodated by said second accommodating part, and defines the opening part, and
wherein said opening part of the connecting part has an area of 125 mm² or more, an average distance between the one of the mask or the object which is accommodated by said second accommodating part and the projecting part is 2 mm or less, and a length of the projecting part in the scan direction is 2 mm or more.

10. An exposure apparatus comprising:
a projection optical system for projecting a pattern of a mask onto an object using a light with wavelength of 20 nm or less from a light source;
a first accommodating part for accommodating the projection optical system;
a second accommodating part for accommodating one of the mask or the object, said first and second accommodating parts having different pressures; and
a connecting part for defining an opening part that connects said first and second accommodating parts to each other,
wherein an equation Ps/Po=100 is met, where Po is the pressure of the first accommodating part, and Ps is the pressure of the second accommodating part,
wherein said exposure apparatus transfers the pattern onto the object by scanning the mask and the object in a scan direction,
wherein said connecting part has a convex section that projects toward the mask, and the convex section includes a projecting part that bends in almost parallel to the mask, and defines the opening part, and
wherein said opening part of the connecting part has an area of 2000 mm² or more, an average distance between the mask and the projecting part is 2 mm or less, and a length of the projecting part in the scan direction is 16 mm or more.

11. An exposure apparatus comprising:
a projection optical system for projecting a pattern of a mask onto an object using a light with wavelength of 20 nm or less from a light source;
a first accommodating part for accommodating the projection optical system;
a second accommodating part for accommodating one of the mask or the object, said first and second accommodating parts having different pressures; and
a connecting part for defining an opening part that connects said first and second accommodating parts to each other,
wherein an equation Ps/Po=100 is met, where Po is the pressure of the first accommodating part, and Ps is the pressure of the second accommodating part,
wherein said exposure apparatus transfers the pattern onto the object by scanning the mask and the object in a scan direction,
wherein said connecting part has a convex section that projects toward the mask, and the convex section includes a projecting part that bends in almost parallel to the mask, and defines the opening part, and wherein said opening part of the connecting part has an area of 2000 mm² or more, an average distance between the mask and the projecting part is 1 mm or less, and a length of the projecting part in the scan direction is 2 mm or more.

12. An exposure apparatus as in one of claims 1-11, wherein said first and second accommodating parts and a partition to form the opening part are separately supported.

* * * * *